United States Patent [19]
Patel et al.

[11] Patent Number: 5,296,756
[45] Date of Patent: Mar. 22, 1994

[54] SELF ADJUSTING CMOS TRANSMISSION LINE DRIVER

[76] Inventors: Hitesh N. Patel, 8610 Causeway, Houston, Tex. 77083; Jakob H. Hohl, 10249 E. Placita Cresta Feliz, Tucson, Ariz. 85749; Olgierd A. Palusinski, Dept. of ECE, Univ. of Arizona, Tucson, Ariz. 85719

[21] Appl. No.: 14,656

[22] Filed: Feb. 8, 1993

[51] Int. Cl.[5] ............................................ H03K 17/16
[52] U.S. Cl. .................................... 307/443; 307/270; 307/353
[58] Field of Search ............... 307/516, 353, 475, 443, 307/451

[56] References Cited

U.S. PATENT DOCUMENTS

| | | | |
|---|---|---|---|
| 4,437,024 | 3/1984 | Wacyk | 307/270 |
| 4,719,369 | 1/1988 | Asano | 307/451 |
| 5,095,231 | 3/1992 | Sartori et al. | 307/475 |
| 5,134,311 | 7/1992 | Biber | 307/270 |
| 5,220,219 | 6/1993 | Barber | 307/353 |
| 5,254,883 | 10/1993 | Horowitz | 307/443 |

OTHER PUBLICATIONS

Knight, A Self-Terminating Low-Voltage Swing CMOS Output Driver, IEEE Journal, v. 23, #2, Apr. 1988.

Primary Examiner—Edward P. Westin
Assistant Examiner—Andrew Sanders

[57] ABSTRACT

An automatic system for adjusting the output impedance of fast CMOS drivers, wherein the output impedance of a plurality of slaved drivers is adjusted by a circuit for measuring and correcting mismatch between the output impedance of one of the drivers, taken as reference and dedicated for this purpose, and the impedance at the input of a reference transmission line, equal in geometry to the lines connected to the other drivers. The voltage measured at the far end of the reference line is sent to a differential amplifier where it is compared with the supply voltage of the final driving stage. According to the comparison result at specific time intervals, a signal is supplied to the regulator which supplies power to the penultimate driving stage, thereby controlling the resistance of the driver to match the line impedance.

6 Claims, 4 Drawing Sheets

SELF ADJUSTING CMOS TRANSMISSION LINE DRIVER

FIELD OF THE INVENTION

The present invention relates to digital electronic circuits and, more particularly, to an adaptive system for automatic adjustment of the CMOS driver impedance to match the transmission line impedance.

BACKGROUND OF THE INVENTION

It is known that when a driver is to send a digital signal to a remote receiver through a transmission line there can be problems in the case in which there is no good match between the transmission line impedance and the input and output impedances of the circuits connected therewith. Generally, in these cases there are power losses and multiple reflections which can cause an error probability increase in the symbol transmitted at a given instant, because, in addition to the symbol transmitted at the given instant, there are present at the receiver, vestiges of symbols transmitted in preceding time intervals and reflected by the line ends.

These disadvantages can be eliminated if at least the driver output impedance is rendered equal to the characteristic impedance of the line. In fact, even though there may be a mismatch at the end of the line connected to the receiver, the input impedance of a rather long line is almost equal to the characteristic line impedance. That would result in a reflection at the far end of the line, but the reflected signal is absorbed at the input by the driver output impedance, whose value is equal to the line impedance, thus avoiding multiple reflections.

However, drivers with output impedance equal to the characteristic impedance of the usual transmission lines are not easy to build, owing to unavoidable tolerances in the fabricating process. Transmission lines can have tolerances in the characteristic impedance also, but these tolerances are typically much smaller than those of integrated circuits. It is hence advisable to have an automatic system for adjusting the driver output impedance so as to obtain a good match to the line, independent of fabrication tolerances and accidental circuit variations.

It is also convenient that the driver output impedance be made equal to the characteristic line impedance without using an external additional resistance, in order to avoid an oversizing of the output circuit with consequent speed loss and power consumption.

A solution to these problems has been described in the article entitled "A Self-Terminating Low-Voltage Swing CMOS Output Driver" by Thomas F. Knight et al., IEEE Journal of Solid State Circuits, Vol. 23, No. 2, April 1988.

In this system, the output impedance of a plurality of drivers contained in the same integrated circuit is controlled by a suitable circuit, also housed in the integrated circuit, comprising a reference driver, analogous to those controlled, and a receiver. The reference driver sends a clock signal, locally-generated for this control purpose, onto a transmission line length with the same characteristics as those of the lines connected to controlled-driver outputs. The line output is connected to the input of a receiver that extracts from the received signal an enabling signal synchronized to logic-level transitions.

The voltage at the input of the reference line is read continuously by a threshold comparator, whereby it is compared with a reference voltage of value equal to half the maximum value of the output voltage of the driver under matching conditions. The information at the output of the comparator is used to control the driver output impedance.

However, this circuit has a number of disadvantages.

A first disadvantage is the comparison of the near-end line voltage in lieu of comparing the far-end line voltage to a reference. This requires additional circuitry for exact timing of the comparison, which has not been disclosed in the paper.

The second disadvantage is the requirement that the (0.5 V) reference voltage is required to be precisely equal to one half of the (1 V) supply voltage of the last driver stage and that any deviations from this ratio produces a corresponding mismatch condition. Unavoidable tolerances in integrated circuits make this precise ratio disproportionately costly to achieve.

The third disadvantage is the use of additive 1 V, −5 V and 0.5 V supplies, which is not economical for integrated circuit manufacture.

Finally, the circuitry for proper timing of the comparator is not provided.

Another solution to these problems has been described in the U.S. Pat. No. 5,095,231 entitled "Automatic System for Adjusting the Output Impedance of Fast CMOS Drivers" by Sartori et al.

This system uses the same principles as Knight and Krymm, but also has several disadvantages, and also compares the voltage at the input of the reference line to a reference voltage.

A first disadvantage is that it uses an off-chip resistor for termination of the transmission line. Consequently, the driver on-resistance has to be negligible compared to the characteristic line impedance, leading to an oversized output circuit with speed loss and greater power consumption. Furthermore, the external termination resistor drastically increases the manufacturing costs.

A second disadvantage is due to the additional 0.5 V reference supply required for comparison of the near-end line voltage and the requirement that this supply voltage precisely equals one half of the supply voltage of the last driver stage. This is not practical for the manufacture of integrated circuits.

OBJECT OF THE INVENTION

It is an object of the invention to provide an adaptive system for automatically adjusting the output impedance of the driver to match the line characteristic impedance, which does not require an external terminating resistor, and additional 1 V, 0.5 V, and −5 V power supplies.

It is another object of the invention to provide a sensing system for the termination condition of the transmission line which does not need two voltages where one is precisely half as large as the other, and which operates with relaxed timing conditions.

SUMMARY OF THE INVENTION

The present invention provides an automatic feedback-control system that consists of a reference driver driving a reference transmission line forming a loop such that its end connects to a receiver on the same chip. The input impedance of the receiver is high, such that the end of the reference transmission line can be considered unloaded. The reference driver launches a pulse train onto the transmission line and the signal is monitored at its unloaded end. The output stage of the reference driver is designed such that its output impedance can be varied by means of a control voltage, and thus adjusted to exactly match the impedance of the reference transmission line. At a perfect match, the amplitude of the pulse train at the end of the transmission line is equal to the dc supply voltage of the output stage of the driver. If the driver impedance is too high, the said amplitude is lower, and if the driver impedance is too low, the amplitude is higher. A feedback circuit compares the said amplitude to the supply voltage of the driver output stage and derives from it a reference voltage that varies in the opposite direction of the pulse train amplitude at the end of the transmission line. This reference voltage is applied to the reference driver and to all other off-chip drivers on the same chip. The reference voltage causes the output impedances of the drivers to be reduced when it rises and vice versa and to stabilize these impedances at the value matching the impedance of the reference line. Because all transmission lines on a circuit board can easily be manufactured to have nominally the same impedance, the matching condition is achieved for all drivers simultaneously.

This type of driver allows the driver impedance to track the line impedance, with the maximum difference in the impedances not exceeding 3% for worst case process variations of approximately 33%.

BRIEF DESCRIPTION OF THE DRAWINGS

The foregoing and other characteristics of the present invention will become more readily apparent from the following description reference being made to the accompanying drawings.

SPECIFIC DESCRIPTION

Figure 1:
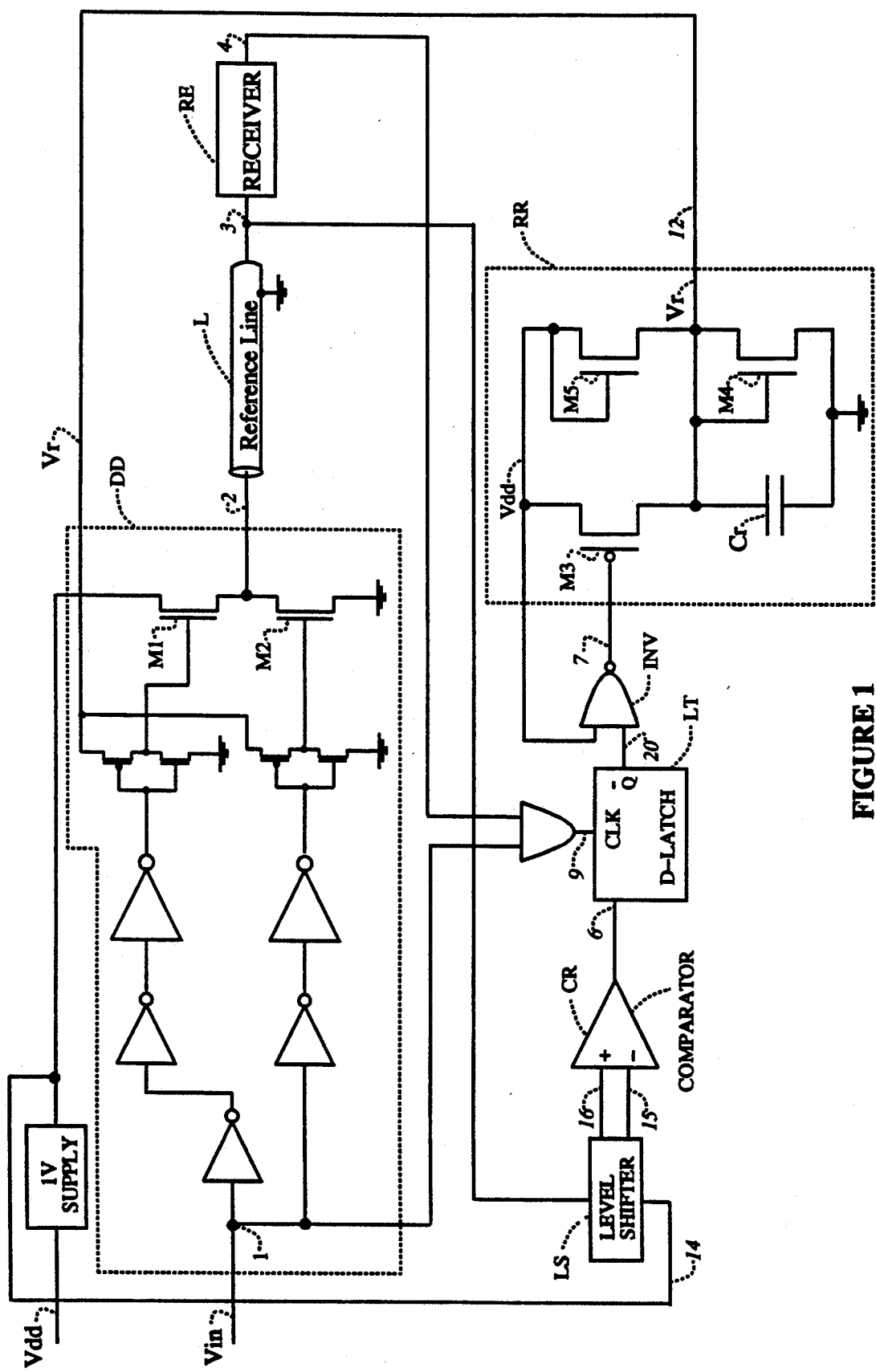
FIG. 1 is a schematic illustration of the Self Adjusting CMOS Line Driver in accordance with an embodiment of the invention.

According to the invention, a circuit for sensing and correcting the impedance mismatch between the on-resistance of the dedicated driver, DD, and the characteristic impedance of the looped transmission line, L, terminated at the driving end by the driver on-resistance, as opposed to termination at the receiving-end by an off-chip resistor, as used by Sartori et al., is described, with the aid of the schematic diagram shown in FIG. 1.

The on-resistance of the reference driver, DD, is measured indirectly by measuring the far-end (second end) voltage of the line, L, which under perfect matching conditions is equal to the 1 V supply voltage applied to the final driving stage, consisting of transistors, M1 and M2. This method, instead of measuring the near-end (first end) voltage of the line, as used by Sartori et al. and Knight et al. which necessitates the use of another supply voltage precisely equal to one half of the supply voltage of the last driver stage, uses the supply voltage of the final driver stage as a reference for the comparison of the voltage at the far-end of the line. Furthermore, a termination at the far-end needs an oversized final driver stage, as used by Sartori et al., causing speed loss and greater power consumption. The supply voltage is derived on-chip from the standard 5 V supply, while Knight et al. use an off-chip supply which is not economical for integrated circuit manufacture. The driver on-resistance can be controlled by varying the gate voltage of transistors, M1 and M2 of the output stage within certain limits determined by geometrical dimensions of the transistors themselves.

Figure 2:
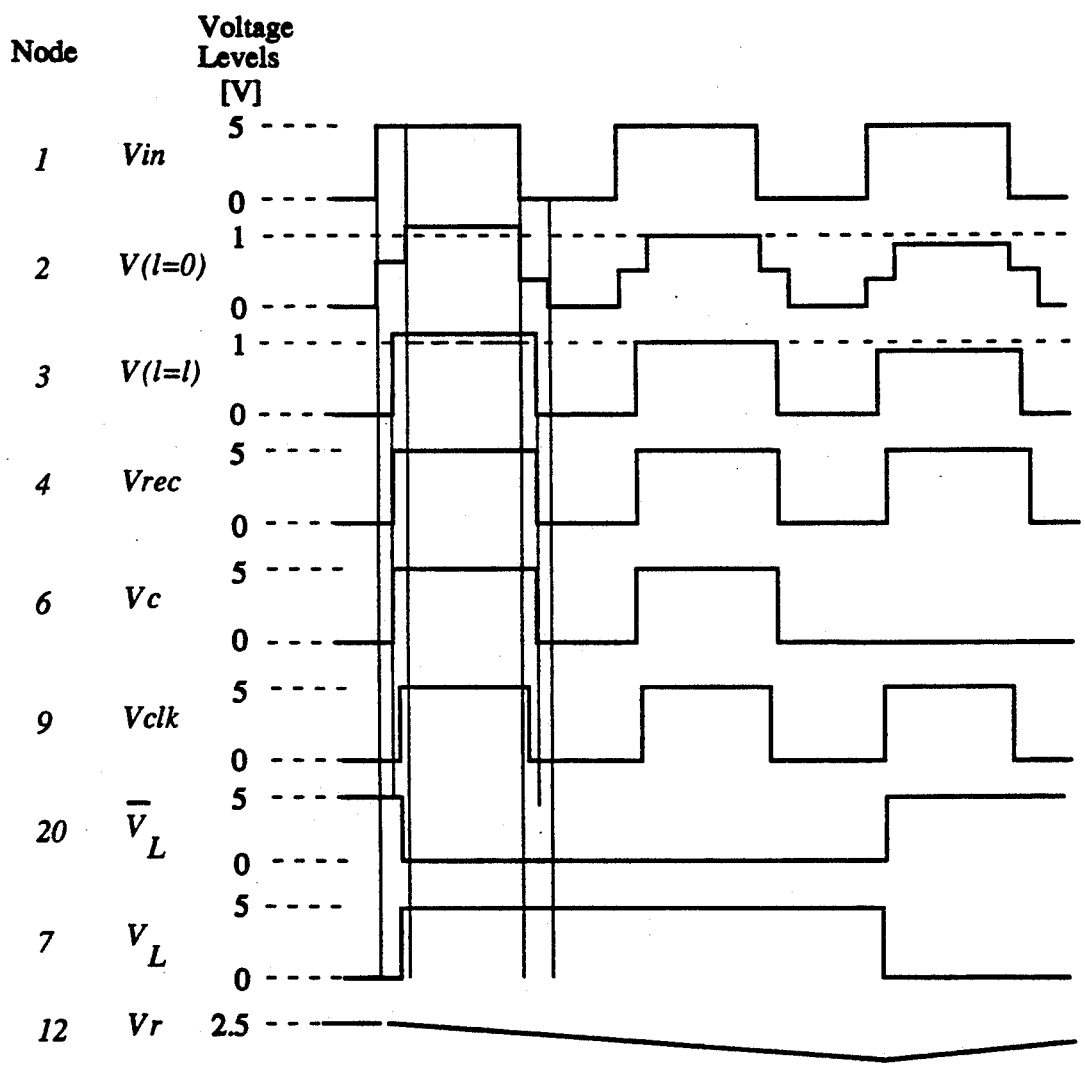
FIG. 2 illustrates a set of timing diagrams for explaining the operation of the adaptive driver shown in FIG. 1.

As a consequence, under perfect matching conditions, the signal amplitude at the output of the transmission line, L, is 1 V, while under mismatch conditions this value changes, as shown in the third trace of FIG. 2. The system operates so as to vary the on-resistance of the reference driver, DD, till a signal amplitude of 1 V is reached again.

The reference driver receives a clock signal, as shown in the top trace of FIG. 2, at its input node, 1, generated by a suitable generator not shown in FIG. 1 because many circuits for this purpose are generally known.

The circuit for measuring and correcting the impedance mismatch consists of the level shift circuit, LS, the comparator circuit, CR, the D-latch, LT, the inverter, INV, and the regulator circuit, RR. The signal at the far-end (second end) of the transmission line, at node 3, as shown in the third trace of FIG. 2, is continuously compared with the 1 V dc supply voltage at node 14. To this end, the two voltages are level-shifted by equal amounts in the circuit, LS, and applied to the two inputs of the differential amplifier, CR, the output node, 6, of which is at a high level whenever the potential at node 3 is higher than the 1 V level at node 14. This condition prevails only during the time intervals when the pulse signal is at its up level, while simultaneously the output impedance of the driver is lower than the line impedance, as shown in the fifth trace of FIG. 2.

Node 6 is the data input to the D-latch, LT. The clock signal for the latch at node 9 is derived as the AND function of the clock signal at node 1 and the amplified output signal from the transmission line at node 4. This signal is a replication of the clock signal, except that its up-transition is delayed by the delays of the driver, the transmission line and the receiver circuit, as shown by the sixth trace of FIG. 2. As indicated in FIG. 2, which shows traces of signals at various nodes of the circuit, the up-transitions at node 6 precede the up-transitions at node 9, while the down-transistions at node 6 lag those at node 9. When node 9 is at its up-level, the latch is controlled by the level at node 6, and operates as an inverter from node 6 to node 20. When the clock signal at node 9 switches to its down level, the latch and the voltage at node 20 remain in their prevailing states. The logic signal at node 20 is inverted and powered up by the inverter circuit, INV, and supplied from the output node, 7, to the PMOS transistor, M3. Thus, when the pulse amplitude at node 3 exceeds the voltage at node 14, i.e., when the output impedance of the reference driver is too low, then there appear pulses at node 6, the latch output settles to its low state, node 7 settles to its high state, and the transistor, M3, is turned off. Alternatively, too low an output impedance of the reference driver causes the transistor, M3, to be turned on. When transistor, M3, is turned off, the smoothing capacitor, Cr, discharges through the NMOS transistor, M4, and the control voltage, Vr, drops steadily. This reduces the gate voltage to transistors, M1 and M2, of the dedicated driver, DD, thereby increasing the driver on-resistance. This continues till the line voltage at node 3 is lower than the supply voltage of the dedicated driver, DD. Then, the output of the comparator, CR, remains at a low level, and the PMOS transistor, M3 turns on. Consequently, the smoothing capacitor, Cr, charges through the resistance of transistors, M3 and M5, in parallel, such that Vr rises steadily. This increases the gate voltage to transistors, M1 and M2, of the dedicated driver, DD, thereby reducing the driver on-resistance.

Figure 3:
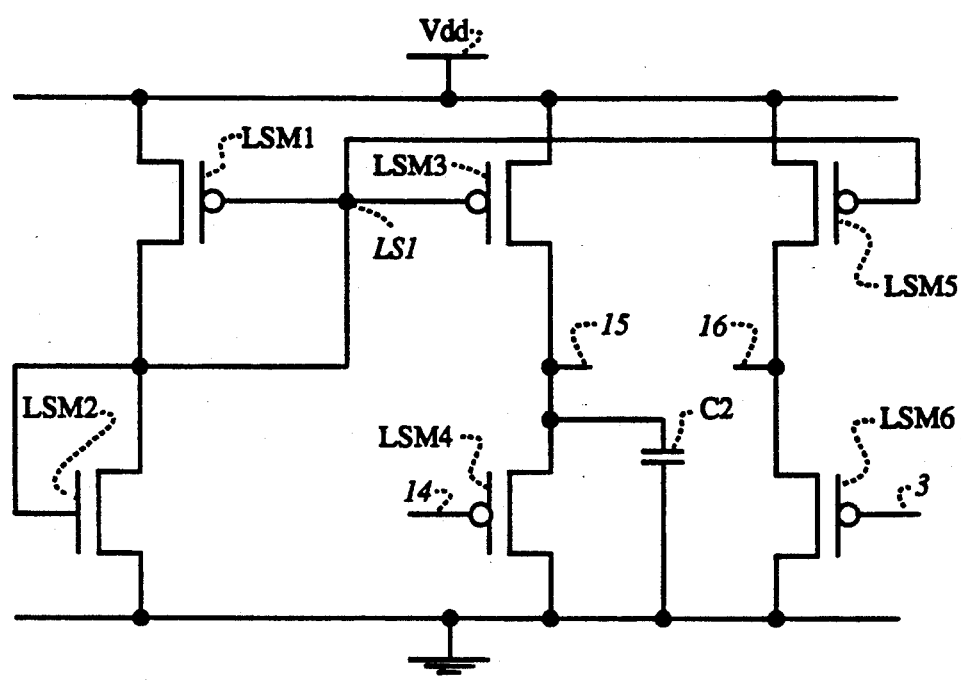
FIG. 3 shows a schematic illustration of the level shifter in accordance with an embodiment of the invention.

Referring to FIG. 3, there is shown an example of a level-shifter circuit, LS, used in the adaptive driver design. Other level-shifter circuits with substantially similar operating characteristics would be equally applicable in its place. The level shifter circuit of FIG. 3 comprises PMOS transistors, LSM1, LSM3, LSM4, LSM5 and LSM6, and an NMOS transistor, LSM2. The circuit is a symmetric circuit with transistors, LSM3, LSM5; and LSM4, LSM6, having same device dimensions. All transistors operate in saturation. Transistors, LSM1 and LSM2, act as a voltage divider, providing a constant 3.5 V at the gate of transistors, LSM3 and LSM5. The 1 V supply to the final driving stage of the driver, DD, is applied to the gate of transistor, LSM4, node 14, while the far-end voltage of the reference line, L, is applied to the gate of transistor, LSM6, node 3. Both these node voltages are level shifted by approximately 2 V and are made available at nodes, 15 and 16, and applied to the comparator, CR, shown in FIG. 4. This circuit eliminates the need for a −5 V supply for the comparator which is required by the circuit designed by Knight et al. A capacitor, C2, is connected between the level-shifted supply of the final driver stage, node 15, and ground, to stabilize the signal during switching.

Figure 4:
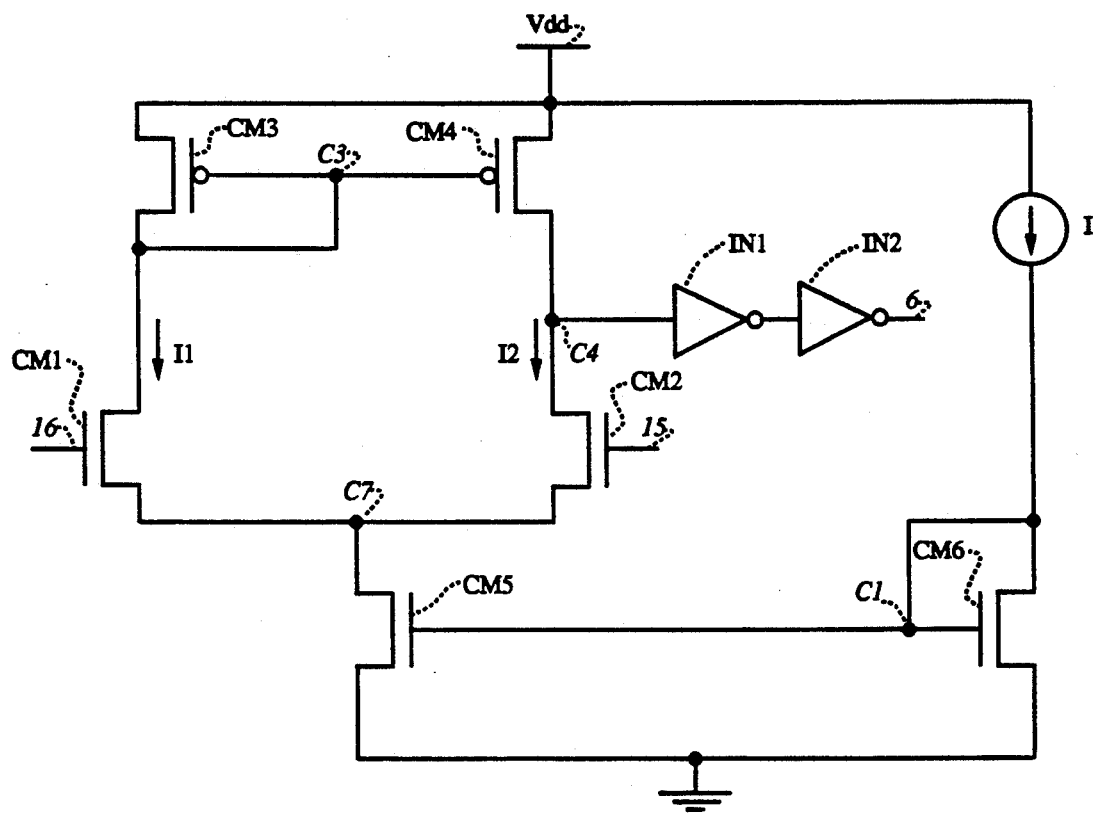
FIG. 4 shows a schematic illustration of the comparator in accordance with an embodiment of the invention.

Referring to FIG. 4, there is shown a differential amplifier circuit used as a comparator, CR. Other comparator circuits with substantially similar operating characteristics would be equally applicable in its place. This circuit comprises PMOS transistors, CM3 and CM4, and NMOS transistors, CM1, CM2, CM5 and CM6. Transistors, CM3 and CM4, are used as a current mirror to form the load devices and the differential output signal is converted to a single-ended signal, taken from the drain of transistors, CM2 and CM4. When a differential voltage is applied between the gates, with the gate to source voltage of transistor, CM1, being greater than that of transistor, CM2, an increase in $I_1$ and decrease in $I_2$, by an equal increment, $\Delta I$, which is mirrored through transistors, CM3 and CM4, results. Therefore, the voltage at node C4 rises, and the cascaded inverters, IN1 and IN2, at this node pull the output voltage at node 6 to 5 V. On the other hand, if the gate-to-source voltage of transistor, CM1, is less than the gate-to-source voltage of transistor, CM2, the current, $I_2$, is greater than $I_1$, thus pulling node 6 to a lower voltage level. The balanced circuit is designed such that all devices are in saturation. This is achieved by matching transistor, CM1, with transistor, CM2, and transistor, CM3, with transistor, CM4.

The latch, LT, the inverters INV, INV1 and INV2, and the 1 V supply are commonly used circuits available in design handbooks, while the receiver, RE, is similar to the design by Knight and Krymm.

We claim:

1. A MOSFET integrated circuit on a chip comprising:
a plurality of substantially identical off-chip driver circuits, each having a final stage consisting of two NMOS output transistors connected in series and operated by a supply voltage in the ohmic region thereof, each of said driver circuits having an output impedance that can be varied by a control voltage, one of said driver circuits being dedicated as a reference driver and driving a first end of a reference transmission line with characteristic impedance substantially equal to the output impedance of the reference driver, and said reference transmission line having a second end in substantially open circuit;
means for applying a clock signal to the reference driver;
a comparator circuit for comparing the amplitude of the clock signal at said second end of said reference transmission line with said supply voltage and sampling the comparison result at suitable instants in each clock cycle;
means for storing sampled comparison results over the entire clock cycle;
means for deriving therefrom said control voltage for varying said driver output impedance, and said control voltage rising when said clock signal amplitude at said second end of the reference transmission line is lower than said supply voltage, and said control voltage declining when said clock signal amplitude is higher than said supply voltage;
means for applying said control voltage to said substantially identical off-chip driver circuits, including said dedicated reference driver, wherein a node between said NMOS output transistors connected in series forms the output node, and where said output transistors are turned on alternatively to a controlled level of impedance by separate CMOS inverters having said control voltage as their supply voltage.

2. The MOSFET integrated circuit as defined in claim 1, where said supply voltage is generated by a voltage regulator circuit on the same chip.

3. The MOSFET integrated circuit as defined in claim 2, where said comparator circuit consists of a level shift circuit that shifts the level of the signal at the second end of said reference transmission line and the level of said supply voltage upward by identical amounts and applies the resulting voltages to said comparator circuit.

4. The MOSFET integrated circuit according to claim 3, where said means for storing said sampled result and for deriving said control voltage therefrom comprises:
a receiver circuit that senses said clock signal at the second end of said reference transmission line and amplifies and shapes it for conforming to a standard logic signal level;
a logic AND circuit for forming an AND-function of said amplified and shaped signal from the second end of said reference transmission line and said clock signal supplied to the reference driver for forming a latch clock signal;
a data latch operated with said latch clock signal as clock signal and the output signal of said comparator circuit as the data signal;
a regulator circuit for smoothing the voltage from the inverse output of said latch and for applying said inverse output with low impedance as said control voltage to all said separate CMOS inverters of said off-chip drivers, including said reference driver.

5. The MOSFET integrated circuit according to claim 4, where said supply voltage has a value of 1.0 V.

6. The MOSFET integrated circuit defined in claim 1, wherein said clock signal has a frequency of the same order as a bit rate of data signals applied at the inputs of said off-chip drivers.

* * * * *